United States Patent [19]
Weinberg et al.

[11] Patent Number: 5,537,021
[45] Date of Patent: Jul. 16, 1996

[54] LOW-LOSS RESONANT CIRCUIT FOR CAPACITANCE DRIVER

[75] Inventors: Simon H. Weinberg, Lillois; Thomas A. A. A. Canon, Court St. Etienne, both of Belgium

[73] Assignee: Alcatel Bell-SDT S.A., Charleroi, Belgium

[21] Appl. No.: 336,799

[22] Filed: Nov. 9, 1994

Related U.S. Application Data

[63] Continuation of Ser. No. 951,401, Sep. 25, 1992, abandoned.

[30] Foreign Application Priority Data

Sep. 27, 1991 [EP] European Pat. Off. .............. 91202547

[51] Int. Cl.$^6$ ...................................................... H03H 1/00
[52] U.S. Cl. ................................................. 320/1; 323/288
[58] Field of Search ..................... 320/1, 5, 14; 307/109, 307/110; 323/288

[56] References Cited

U.S. PATENT DOCUMENTS

| | | | |
|---|---|---|---|
| 3,614,594 | 10/1971 | Rosa ......................................... | 363/138 |
| 3,842,341 | 10/1974 | Goldberg .................................. | 363/27 |
| 4,405,975 | 9/1983 | Overstreet et al. ........................ | 320/1 |
| 4,524,289 | 6/1985 | Hammond et al. ...................... | 307/110 |
| 4,584,184 | 4/1986 | Higashino et al. ...................... | 320/1 X |

OTHER PUBLICATIONS

IEEE Power Electronics Specialists Conference Record, 1987, pp. 404–413, Zero–Voltage–Switched Quasi–Resonant buck and flyback Converters–Experimental results at 10 MHz. W. Tabisz, P. Gradzki, F. C. Lee.

Proceedings of the High Frequency Power Conversion Conference, pp. 438–445, ultra–fast isolated gate drive circuit, J. D. Repp, May 1989.

Theory and Design, G. Chryssis, McGraw–Hill Publishing Company, 1989. High–Frequency Switching Power Supplies, pp. 52–53.

*Primary Examiner*—Peter S. Wong
*Assistant Examiner*—Gregory J. Toatley
*Attorney, Agent, or Firm*—Ware, Fressola, Van Der Sluys & Adolphson

[57] ABSTRACT

A fast lossless power MOSFET gate capacitance (C) driver uses a 3-winding transformer (T) to secure clamping (N, Vc, D) of the turn-on voltage level by coupling of the winding (N1) in the capacitance charging circuit to that (N) across the clamping potential (Vc) in series with a clamping diode (D). A similarly coupled winding (N2) in the discharging circuit can ensure clamping of the turn-off level, both rise and fall starting at zero current and being sinusoidal. Alternatively, a high Q constant current charge can be used with the charging circuit switch (S1) DC isolated from the capacitance and using the magnetising current built up in the transformer. Instead of clamping the turn-off level, the discharging circuit can be switched (S2) during magnetising current build-up (S1) using a separate inductance to reverse the capacitance voltage in a half-wave resonant circuit.

32 Claims, 2 Drawing Sheets

5,537,021

LOW-LOSS RESONANT CIRCUIT FOR CAPACITANCE DRIVER

This is a continuation of application Ser. No. 07/951,401 filed on Sep. 25, 1992 now abandoned.

TECHNICAL FIELD

The invention relates to a resonant circuit using switching means, in which for one condition of a first switch, a capacitance becomes part of a charging circuit including a DC voltage source in series with an inductance.

BACKGROUND OF THE INVENTION

Such a resonant circuit is disclosed for instance, in an article by W. A. Tabisz, P. Gradzki and F. C. Lee published in the IEEE Power Electronics Specialists Conference Record, 1987, p. 404–413, Zero-Voltage-Switched quasi-Resonant buck and flyback Converters-Experimental results at 10 MHz. In general, resonant LC circuits using switching means as well as diodes have been employed for a variety of purposes at various frequencies and at relatively high or low power levels. In electronic applications based on the use of integrated circuits, one field having substantially relied on resonant and so-called quasi-resonant circuits is that of power supply circuits, particularly those using power MOSFETs at high frequencies, e.g. 10 MHz. The above article is an example of such DC/DC converter developments.

While many resonant-mode topologies have been defined for such High Frequency DC/DC converters using MOSFETs, the described buck ZVS-QRC uses the initially defined resonant circuit as a quasi-resonant MOSFET gate drive. This even more particular application of such resonant circuits is especially significant as turning a MOSFET on/off requires charging/discharging the input capacitance appearing between its gate and source bringing significant power dissipation, proportional to the frequency, and switching speed problems, Using another lower power MOSFET, driven by a non-resonant gate drive, as switching means between the gate and the converter reference potential connected to the source through the converter flywheel diode, when this control MOSFET is off the controlled converter power MOSFET is on. Upon the control MOSFET being turned on, the gate potential of the controlled power MOSFET practically drops to the common reference potential whereas its source potential remains momentarily higher due to the parasitic capacitance of the flywheel diode. Hence, this negative bias between gate and source reduces the turn-off time of the controlled power MOSFET. While the control MOSFET is on, the inductance current increases linearly but this peaks off upon the control MOSFET being turned off, thereby setting up the series resonant circuit formed by the inductance and the controlled power MOSFET input capacitance. Upon the inductance current returning to zero, resonance is stopped by a diode in series with the inductance becoming blocked, the gate to source potential reaching the necessary potential for the controlled power MOSFET to be turned on in a resonant manner reducing the power dissipation by half as compared to conventional gate drives. As for the above control MOSFET, these drive circuits can rely on bipolar transistors, gates and other integrated circuits.

With other topologies or applications in which the source of the power MOSFET exceeds 20 volts with respect to the gate drive ground, or in which the source is directly connected to the reference ground, a negative gate drive voltage cannot be obtained. In addition, DC isolated. MOSFET gate drive circuits are needed if the MOSFET source is momentarily above 20 volts with respect to the gate drive ground, e.g. the article by J. D. Repp in the May 1989 Proceedings of the High Frequency Power Conversion Conference, p. 438–445, Ultra fast isolated gate drive circuit. It is pointed out therein that transformer isolated power MOSFET gate drives should possess various desirable properties including low power consumption. For the described 100 watt converter, a consumption of 2.5 watt is deemed low but since this is at 500 kHz only, it is clear that the losses can be quite significant at substantially higher frequencies and indeed, the author states there is room for further improvement in this respect.

Thus, the quasi-resonant gate drive of the first article uses a common reference or ground potential for the power MOSFET input capacitance and for the converter whereas the second article indicates this is not suitable for other converter topologies requiring galvanic isolation provided by a transformer. Moreover, the gate drive of the first article only provides a positive potential across this input capacitance and a negative potential from gate to source is only obtained by a positive potential remaining temporarily at the source with respect to ground, due to the junction capacitance of the flywheel diode used in this buck converter. This resulting negative gate bias is on the other hand desirable for MOSFET turn-off. In addition, this circuit only saves one half of the total gate power as compared to the conventional gate drive. Further, this known circuit implies that the capacitance is charged at the desired positive gate level to turn the power MOSFET on up,on a series diode blocking the resonant current as it decreases to zero, the energy stored in the inductance having then been transferred to the capacitance. Any variation in this energy, i.e. tolerances, will lead to insufficient or excessive voltage across the capacitance.

SUMMARY OF THE INVENTION

Accordingly, an object of the invention is the realisation of a charging circuit as initially defined but allowing a reduction of the losses to practically zero both during the charge and the discharge of the capacitance part of the resonant circuit.

Another object is to ensure two precisely determined voltage levels of opposite polarity across the capacitance so that these can ensure proper control of the on and off condition of a power MOSFET.

Yet a further object is to enable the achievement of such aims in a circuit wherein the capacitance is DC isolated by a transformer.

In accordance with a first feature of the invention, the circuit includes a second inductance and, for one condition of a second switch, the capacitance becomes part of a discharging circuit.

Using such a pair of switches, neither being directly in shunt across the capacitance as in the circuit of the first article, it becomes possible to alternate positive and negative potentials across the capacitance in a steady state manner. This can be illustrated merely by taking into account some unavoidable resistive losses, e.g. of the switch, in the charging circuit only. With -Vo as the initial negative voltage across the capacitance, after a half-period of natural resonance this will become V+d(V+Vo) where V is the voltage of the DC charging source and d the logarithmic decrement due to the series charging circuit including not only the inductance and the capacitance but also a resistance. After a half-period discharge, the voltage will return to -V-d(V+ VO), i.e. the same absolute value as after the charge but reversed in sign, and this can be made equal to the original -VO when the latter is defined by VO(1−d)=V(1+d). This can be satisfied by a VO value larger than that of V and tending towards the latter as the charging losses increase when d tends towards zero, whereas in the ideally lossless case Vo would become infinitely large when d has unity value. Such a stabilised periodic operation corresponds to the energy drawn from V being equal to the resistive losses or fC(VO)**2/2 where f is the frequency of operation, C the capacitance value and VO the steady-state positive or negative value defined by the above relation. It would be desirable to obtain such positive and negative capacitance potentials without relying on resistive losses to secure a steady state operation.

In accordance with another feature, voltage clamping means are coupled to the capacitance.

In this way, one is no longer dependent on a certain amount of losses to be able to periodically switch the capacitance voltage between two distinct values. Instead, both the charge and discharge may occur without any significant predetermined energy losses, only the limited unavoidable parasitic resistances of the circuit remaining. Indeed, clamping means may allow energy to be returned to the supply source at least during one of the voltage transitions, e.g. during the charge with the voltage across the capacitance being inverted in sign during a half-wave resonant discharge. But alternatively, both voltage levels may be clamped and set at arbitrary predetermined values. Additionally, clamping also enables the voltage levels to be defined more accurately. Series diodes in the charge and discharge circuits enable the clamped levels to be retained while the corresponding serial switch is not yet reopened.

It is to be noted that voltage clamping means for a capacitance part of charging and discharging resonant circuits are known in themselves, e.g. the sine wave series resonant converter such as disclosed on p. 52/3 of High-Frequency Switching Power Supplies:Theory and Design, G. Chryssis, Mc Graw-Hill Publishing Company, 1989. Therein however, a single inductance is serially coupled to the capacitance through the primary winding of the output transformer. One of two clamping diodes is shunted across the cacitance connected at one terminal to one of the two DC supply poles, the other diode coupling the live terminal of the capacitance to the other pole. The inductance terminal away from the capacitance is coupled to the two poles via the switches. Thus, these can only be made conductive alternately due to their being serially connected across the DC voltage source. Without such a positioning, in some cases it may be advantageous to have the switches conduct simultaneously as will be explained later. Also the capacitance is only charged in one direction, one of the two capacitance voltage levels being zero, i.e. the reference potential, as in the case of the circuit of the first above article. Moreover, the purpose of this sine wave series resonant converter is not to drive periodically the voltage across the capacitance between two predetermined values. Instead, the energy is extracted through the output transformer towards the converter load. The capacitance part of the resonant circuit and its associated clamping diodes here serve to create two successive half-sine waves of opposite polarity for the current in the primary winding of the output transformer. These form a composite sinusoidal current leading to rectification and filtering of the corresponding voltage across the center-tapped secondary winding.

In accordance with a further feature, the voltage clamping means includes a first transformer winding, a DC voltage source and a diode, all three in a closed series loop with the diode poled so as to be blocked by the source, the transformer having at least a second winding coupled to the capacitance.

Such voltage clamping means not only afford the possibility to realise various advantageous circuits with 2-, 3- or 4-winding transformers and to be discussed below, but the clamping diode need not remain conductive to ensure the maintenance of the clamped voltage level as in the sine wave series resonant converter outlined above. Instead, the diode will pass current only during the time necessary to return the transformer magnetic energy into the clamping DC voltage source which may be the DC voltage source part of the charging circuit. The transformer can use two windings with a common terminal and if they are inductively coupled to another winding achieving DC isolation with these, the DC isolated winding can either be on the side of the DC clamping source or be connected to the capacitance. In the first case, two clamping diodes will each be coupled across the DC clamping source through the first and second windings as with a centre tapped rectifier. The charge and discharge circuits each involving a switch in series with a decoupling diode can then use the same DC isolated winding in series with the capacitance. But in the second case, only a single clamping diode is needed to serve for the two voltage levels. Then, the first and second windings with a common terminal connected to one end of the capacitance can each be in series with their associated switch and decoupling diode, i.e, in the charge and in the discharge circuit respectively.

It should be remarked that such a serial loop clamping circuit using a 3-winding transformer with two of the windings having a common terminal is in itself a feature of the classical isolated DC/DC forward converter, e.g. p. 19 to 24 of the above textbook. But there its purpose is to avoid driving the transformer into saturation as well as high current spikes which could destroy the semiconductor switch in series with the transformer input winding. The shunt capacitance coupled to the output winding is part of the output filter and accordingly charged at a substantially constant DC output level. Foremost, contrary to the flyback converter transformer needing no such clamping winding, the forward converter relies on a pure transformer. Both the input and output windings have a polarity opposite to that of the clamping winding, the inductive energy being stored in a separate series coil part of the filter.

With such a transformer clamping, it now becomes possible for instance to use a 3-winding transformer with two series aiding windings able to pass the capacitance charge and discharge currents respectively. An energy efficient resonant transfer can be secured both for the charge and for the discharge of the capacitance and the single clamping loop circuit can ensure two arbitrary well defined voltage levels of opposite polarity across the capacitance. The latter can be DC isolated from the clamping voltage. The first switch can either be in series with the winding included in the charging circuit or the DC voltage source part of the latter as well as the first switch can also be isolated from the capacitance by using a separate additional transformer. This source will then be branched across the primary winding of this transformer through the first switch and the two windings of the first transformer passing the capacitance charging and discharging current respectively will be serially coupled across the secondary winding of the additional transformer.

Contrary to the quasi-resonant gate drive of the first article, it is no longer essential that an inductance be initially energised. Instead, the initial current when initiating a change in either direction of the potential across the capacitance can be zero and a precise timing of the turn-on and turn-off times can be achieved. Indeed, a resonant energy transfer action takes place, both in the charging or in the discharging circuit, with the instantaneous voltage precisely determined in both cases, i.e. part of a sinusoidal waveform between two well-defined clamping voltage levels.

However, in accordance with alternative embodiments, it is also possible to apply the invention in advantageous ways but retaining the principle of an initial storage of inductive energy prior to charging the capacitance. Using a magnetising winding in series with the charging circuit switch across the DC voltage source in addition to the clamping winding also branched on this source through the clamping diode, energy can be stored in the transformer as the magnetising current increases linearly when this switch is closed. Subsequent opening of this switch can produce change of voltage level across the capacitance as the latter is charged. This can occur for instance with the help of a third transformer winding in series with a diode, this combination being in parallel with the capacitance. Alternatively, the magnetising winding can be serially connected to the live end of the capacitance through the diode. In either case, the capacitance can be discharged through a separate inductance also in series with a diode when the serial discharge switch is closed.

As before, one retains the advantages of charging and discharging the capacitance while incurring only parasitic resistive losses, as well as a precisely determined clamped voltage after charging and/or discharging the capacitance. But one has now an effective current source leading to various advantages such as the possibility to use a relatively large inductance value. Contrary to the circuits discussed so far, this allows a higher Q quality factor than with a smaller inductance whose value is determined by that of the capacitance and by the frequency of operation in order that clamping will be achieved before completing a half-period at the resonant frequency, or when the resonant current returns to zero as in the first above article. Such a higher Q means that unpredictable parasitic series resistance, e.g. from layout copper tracks, device leads, semiconductor bulk resistance, cannot affect the reliability of the design. A current source drive will also be unaffected by MOSFET lead inductances producing an undesirable parasitic feedback slowing down the capacitance voltage rate of change in a classical circuit. A further advantage of a current source in such a circuit is that it becomes possible to have no significant change in capacitance voltage rise time or circuit losses if the capacitance or the frequency is varied by operating in a so-called heavy mode further discussed below.

If the discharge takes place through a separate inductance there is no direct clamping of the discharged capacitance voltage level through the transformer. Indeed, one has merely a half-period of resonance stopped when the discharge circuit series diode is blocked, the charge circuit diode being poled so as to decouple the two circuits. Hence, only an indirect clamping level is obtained by the capacitance voltage changing sign after such an ideally lossless discharge. In practice, especially in view of the lower Q of such a discharge circuit, due to the lower inductance value, parasitic resistances will reduce the magnitude of the capacitance voltage level after the discharge. But in many instances, e.g. for power MOSFET gate drivers, this tolerance effect will be acceptable for the turn-off gate to source bias.

However, the current source advantages but with a high Q and direct clamping for both the charge and the discharge can be obtained by using a 2-transformer symmetrical circuit in which the capacitance receives current through one transformer while the other, with its SO windings reversely coupled with respect to those of the first provides clamping and vice-versa. With such an embodiment, contrary to that relying on no initial magnetising current for the transformer, not only is the capacitance DC isolated by the transformer from the switch in the charging circuit, but symmetry now implies that this is also true for the switch in the discharging circuit.

Further, magnetising current embodiments, such as the symmetrical one envisaged immediately above, also afford DC isolation between the supply and the capacitance.

Other advantages of retaining an initial magnetising current relate to the control operations, First, the discharge circuit switch may be closed simultaneously with that for the charge circuit resulting in easier control.

Second, the circuit may run into what may respectively be called light or heavy modes depending on whether the charge circuit switch is opened during a time sufficiently large or not as to allow the clamping circuit current to fall to zero or not. In the latter case, provided saturation of the transformer is avoided, the non-zero value of the transformer current when the switches are about to be reclosed can vary from one level to another in function of the capacitance value. The latter may change for a variety of reasons, e.g. tolerances on the component value, MOSFET gate to source capacitance depending on drain to source voltage, etc. Such heavy mode operation produces automatic self-compensation for the driver in that one will pass from one periodic steady state, with one value for this residual current before reclosing the switches, to another associated with a different residual current value due to such a change in the capacitance value. Moreover, during the transitional periods before settling into the new steady state, the finite rise time to reach the charged capacitance voltage level when opening the magnetising winding circuit will temporarily increase but returns to its original value when the circuit settles into its new steady state condition linked to the new capacitance value. As in the first embodiment avoiding an initial magnetising current, the charge of the capacitance has a voltage following a half-period of natural resonance before it is clamped. But contrary thereto, this takes place during such a small fraction of this half-period that one approximates a linear rise. Experimental results have confirmed that a change in the capacitance value by several orders of magnitude, e.g. from 1nF to 5,000 times that value, will not lead to significant rise time changes and the self-regulating effect also takes place when the frequency of operation is varied. Hence, power supply applications with a wide variety of control loop designs are possible, i.e. variable or fixed duty cycle or frequency.

Third, such a variable duty cycle may be obtained merely by modifying the frequency of operation of the charge circuit switch, using a separate control for the discharge circuit switch. Thus, the charge circuit switch may be turned on and off at a higher frequency than that for the discharge circuit switch and corresponding to the frequency of the capacitance waveform. This change in the control of the charge circuit switch by merely varying the frequency also means a smaller transformer due to the higher operating frequency. The latter is linked to smaller amounts of energy being delivered to the capacitance for such smaller periods, this being possible by first charging the capacitance and thereafter providing small amounts of charge at the higher frequency to compensate leakage current losses, i.e. a cup and bucket method.

Moreover, the use of a 4-winding transformer DC isolating the capacitance for the DC supply as well as from both switches may enable the latter to be made simultaneously conductive to secure a discharge by short circuit in this transformer.

BRIEF DESCRIPTION OF THE DRAWINGS

The above mentioned and other objects and features of the invention will become more apparent and the invention itself will be best understood by referring to the following description of the embodiments taken in conjunction with the accompanying drawings which represent.

BEST MODE FOR CARRYING OUT THE INVENTION

Figure 1:
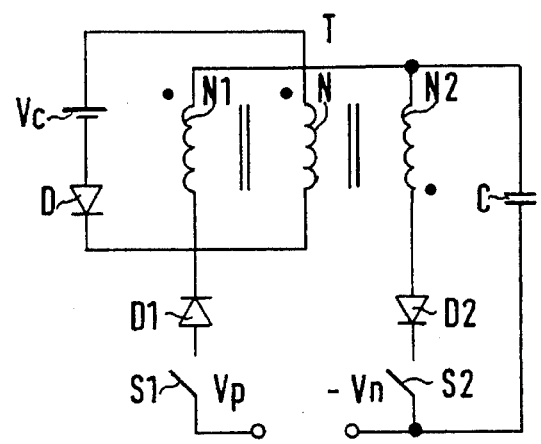
FIG. 1, a first circuit in accordance with the invention using only a single 3-winding transformer for the various inductive coils and a single clamping diode.

Referring to FIG. 1, the main DC voltage source has its positive terminal at a potential Vp connected at one end of winding N1 of transformer T through switch S1 shown in the open condition in series with diode D1. Its negative terminal, at a reference potential -Vn, e.g. ground, is connected in a similar fashion to N2 through S2 and D2, the commoned ends of N1 and N2 being connected to the live terminal of capacitance C whose other terminal is directly biassed at -Vn. Both D1 and D2 are poled so as to allow current to pass in the direction from Vp to -Vn. A third winding N poled as shown with respect to the N1 and N2 series aiding windings with which it has no common terminal is in series with a clamping DC voltage source Vc through diode D poled to block the Vc current. All three diodes may be of the Schottky type while the two switches may be control MOSFETs and the capacitance may be effectively present between the gate and source of a power MOSFET.

If v is the instantaneous potential across C in such a direction that its live terminal is at -Vn+v, while i is the instanteneous current through C, upon the closure of S1 when S2 is open, one may additionally illustrate the principle of operation of the present resonant circuit by defining v and i on the assumption of a purely reactive LC circuit, i.e.

$$v = V - (V+V0)\cos wt + I0(L/C)^{**}(1/2) \sin wt \quad (1)$$

$$i : (V+V0)(C/L)^{**}(1/2) \sin wt + I0 \cos wt \quad (2)$$

wherein -V0 is the initial value of v at time t=0, upon closure of S1, I0 is the initial value of i, w, the natural resonance angular frequency, and related to L and C by $$LC\ w^{**}2 = 1 \quad (3)$$

and V being defined by $$V = Vp + Vn \quad (4)$$

Thus, (1) indicates that after any odd number of half-periods, reopening S1 will leave v at a value independent of the initial I0 current. Selecting the shortest time, i.e. with wt=pi, will minimize tolerance errors related to the timing of S1, as well as the effect of exponential decay, not accounted for by (1) to (3) which considers a purely reactive resonant circuit, caused by such resistances as those associated as parasitic elements with an inductance, a diode and a switch.

Hence, by closing S1 for such a duration, v will tend to go from -V0 toward 2V+V0 upon cos wt=-1 while i starting from Io returns to that value, e.g. zero. If, instead of S1, S2 is now closed for a half-period of natural resonance, v will change its sign in this process to reach -2V-Vo. So far, this charge and discharge of C does not consider the clamping action exerted by Vc, D and N, nor the function of D1 and D2, and in that case a periodic operation of this simplified circuit implies a resistive loss as outlined previously. Indeed, the double operation transforms -Vo into -2V-Vo which could only lead to theoretical steady state operations since Vo would have to be infinitely larger than V. Some resistive losses, e.g. a resistance R (not shown) in series with S1, D1 and N1 in the charge circuit, modify the position, e.g. (3) becoming $$LC_w^{}2 = 1 - C(R^{}2)/4L \quad (3')$$

when the series resistance R is sufficiently small with respect to the characteristic impedance defined by L and C, i.e. $2(L/C)^{}(1/2)$ larger than R. Then, after a half-period of natural resonance the amplitude V+Vo of the cos wt term in (1) is now multiplied by the logarithmic decrement d and given by $$d = ^{} - R(pi)/2wL \quad (5)$$

for such half-period. Since d is now smaller than unity when R is larger than 0, as initially mentioned, steady state periodic operations can give a finite Vo value defined by $$Vo/V = (1+d)/(1-d) \quad (6)$$

becoming, as a first approximation when R is small, $$Vo/V = -1 + 4wL/(pi)R \quad (6')$$

Steady state periodic operations can however be obtained without such predetermined resistive losses when clamping the voltage v so that energy is returned to the source. The particular circuit shown in FIG. 1 uses a common clamping loop Vc, D and N active for both the charge and discharge of C, v being prevented from reaching its peak resonant amplitudes of 2V+Vo and -Vo.

Figure 2:
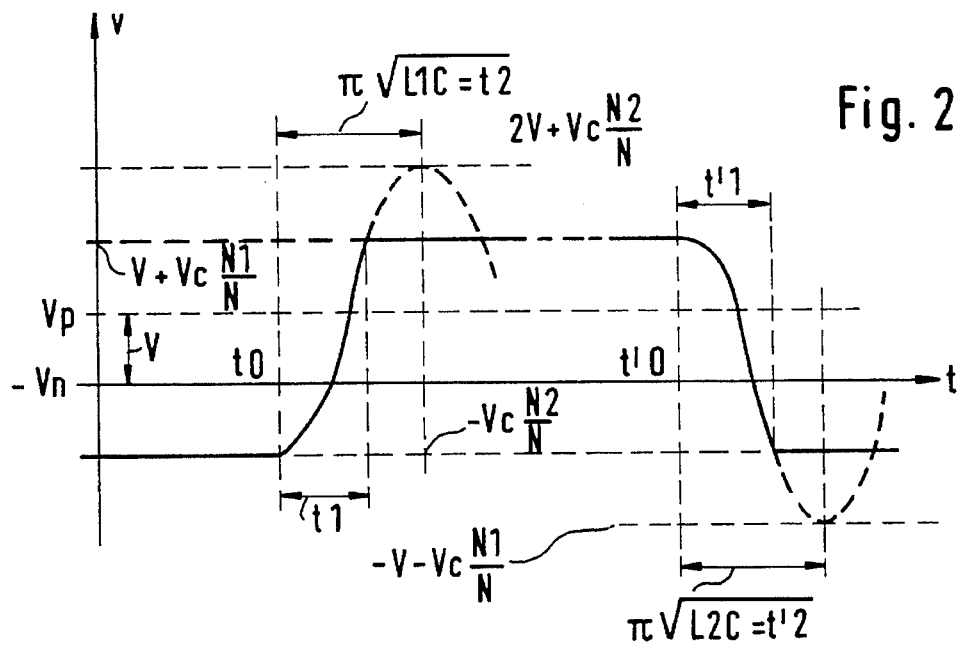
FIG. 2, the charge and discharge voltage of the capacitance used in FIG. 1.

FIG. 2 shows the variation of v under these circumstances both during the charge process, with S1 closed and S2 open, or during discharge with the conditions of the switches reversed and L being now determined by N2 instead of N1 while the effective biassing voltage in the discharge serial loop corresponds to V=0 in (1). With an initial v value of -V0 at t=t0 and with this horizontal bottom level of the voltage across C shown to be more negative than the reference or zero level -Vn, as S1 is closed v varies in accordance with (1) and, if I0=0, towards a positive value of 2V+Vo. But, at t0+t1, for t=t1, it will reach a less positive horizontal top level following the clamping diode D becoming conductive.

This will occur upon the potential across N1 being equal to Vc N1/N since this induces across N a potential equal and opposite to Vc, thus overcoming the blocking bias on the clamping diode D. Since the end of N1 away from C is at V above the -Vn reference, the live terminal of C will thus be clamped at a top level of V+VcN1/N above this reference, as shown. At t=t1, i will have reached a current determined by (2) with I0:0 and the corresponding inductive energy in N1 will be recovered in source Vc after which clamping diode D will again be blocked, this becoming then also the case for D1. Indeed, with C clamped at the top level, this is higher than V at which the anode of D1 is biassed, on the assumption that 51 is still closed when D is again blocked, whereby D1 blocks any reverse current to Vp. At any time after t=t1, switch 51 may thus be reopened.

As shown on FIG. 2, the discharge process initiated by the closure of 52 in FIG. 1 is symmetrical with respect to N1 and N2 while V is not present in the discharge circuit. Hence, since FIG. 1 shows N1 and N2 to be oppositely poled with respect to the clamping winding N, v will be clamped to a bottom level of -Vc N2/N after the discharge process, instead of the top level V+Vc N1/N. Again, temporary conduction of D will ensure clamping, this time at the bottom level, whereafter D2 will be blocked upon D being again in that condition. FIG. 2 represents the discharge starting at instant t'0 and lasting for a time interval t'1 after which S2 may again be reopened.

It also shows in dotted lines the complete half-periods of resonance lasting t2 and t'2 for the charge and discharge processes respectively should these not be interrupted by clamping as explained after a time t1 or lasting more than a quarter period. These half-periods are defined by (3) with L=L1 or l2, the inductances of N1 and N2 respectively, as shown by the values for t2 and appearing on FIG. 2. The corresponding v levels when t=t2 or t'2 are also shown and readily obtained from (1) with I0=0. Indeed, for the charge process one starts from an initial value -V0=-Vc N2/N which would become 2V+V0=2V+VcN2/N if allowed to proceed for a time t2. For the discharge process, the initial -Vo=V+ Vc N1/N would simply be reversed after t'2.

Since the actually attained top and bottom flat levels cannot exceed the respective resonant peak, these four values indicate that, with series aiding windings, the normalised value of V with respect to Vc, i.e. V/Vc, must be larger than the absolute value of the difference between the number of turns of N1 and N2 normalised with respect to that of N, i.e. (N1-N2)/N. This condition allows wide freedom to the designer and for instance an equal number of turns for the two windings N1 and N2 whereby the maximum charge and discharge currents obtained from (2) will be equal. Together with this choice, or with some others, for the transformer T, the, values of Vc and V can also be chosen equal so that a single DC source can be used by branching N and D across Vp and Vn. Alternately, a separate Vc supply may be designed with a lower source resistance than that of the V supply thereby improving clamping. Such a separate Vc supply may also have a higher voltage (and a lower clamping current) e.g. 20 volts, than the V supply e.g. 5 volts. For such values, if turn-on and turn-off potentials of 10 and -5 volts respectively are desired for a power MOSFET, equality between N1 and N2 will thus impose N=4N1:4N2.

If it is desired to have DC isolation between S1 and Vp, Vn on the one hand and C on the other, as noted above, the circuit of FIG. 1 can be modified (not shown) by removing S1 from the shown circuit and by respectively connecting the anodes of D1 and S2 to opposite ends of the secondary winding of a second transformer (not shown) whose primary now includes the serial connection of S1 and is now fed by V across Vp and -Vn.

Figure 3:
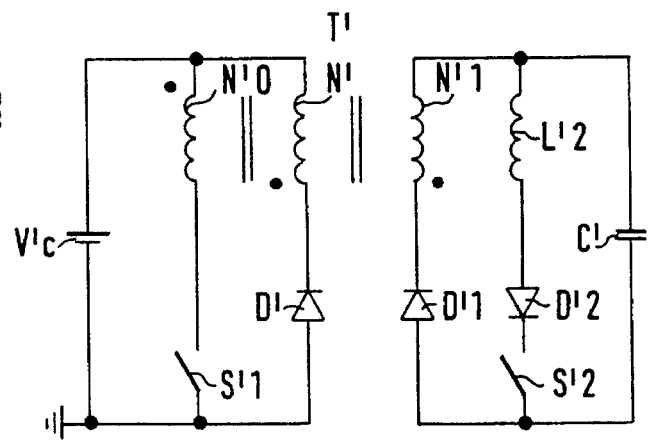
FIG. 3, a second circuit in accordance with the invention where a 3-winding transformer using initially stored magnetic energy now has two windings associated with a single DC voltage source used also for clamping purposes and DC isolated from the capacitance discharged through a separate inductance.

FIG. 3 shows the first of a series of four possible circuits in which magnetic energy is initially stored in the transformer before the capacitance is charged. As represented, the above DC isolation can now be obtained with a single transformer T' but with the addition of a physically separate inductance L'2 completing the discharge circuit for capacitance C' through series diode D'2 and series switch S'2 in the same way as winding N2 of T1 in FIG. 1. Thus FIG. 3 retains the feature of an initial current through an inductance as in the first above article, i.e. the magnetising current builds up through winding N'O of T' when the grounded DC voltage V'c is applied thereon through closure of grounded switch S'1. It is this stored energy which will be used, upon reopening of S'1, to charge C' through winding N'1 in series with diode D'1. Again, as in FIG. 1, a separate winding N' in series with diode D' across V'c enables the clamping action on v, the voltage across C'. During the time S'1 is closed, the discharge circuit through the separate L'2 inductance can be closed through S'2.

In more detail, three successive time intervals can be considered for periodic steady state conditions during which the voltage v across C' will switch from its positive clamped level of V'c N'1/N' to a negative level having a slightly lower amplitude due to resistive losses associated with the lower Q discharge circuit.

First, upon closure of MOSFET switch S'1, magnetising current through N'o will increase linearly from its lower steady state value which may not necessarily be zero since, as previously outlined, such a light mode operation may be replaced by a heavy mode one in which the current has no time to return to zero during the time S'1 is open. During its closure it is possible also to close MOSFET switch S'2 in synchronism therewith using an extra transformer winding (not shown), e.g. as in the case of synchronous MOSFET rectifiers in the output section of a power supply such as disclosed for instance on p. 145 to 147 of the above textbook. The half-period of the discharge resonant transfer to reverse the positive voltage v across C' until D'2 blocks the discharge current, decoupling with respect to transformer T being achieved by the blocked D'1, is determined essentially by L'2 C'2. The main effect of parasitic resistive losses is some reduction in the negative value of v as compared to the clamped positive one in view of the relatively lower Q for the discharge circuit.

On the other hand, once S'1 is opened the voltage v will rise at a substantially linear rate since the time to reach the positive clamping level will only be a very small fraction of the half-period of resonance. Indeed, in FIG. 3, L during the charge can then be a much larger value with the advantage of a high Q. This is readily confirmed by (1) wherein sin wt, with w defined by (3), can now be approximated to wt whereas cos wt is practically unity with the result that the voltage increase is given by Iot/C. The order of magnitude of the rise time is similar to that determined by L'2C', although it may rise temporarily during transient conditions. As outlined above, these may occur in the heavy mode with a minimum transformer current larger than zero and with a steady state value adjusting itself as a function of the C' value. As v rises through zero, the energy stored in T' continues to rise initially after S'1 is turned off, because the energy stored in C' when v is negative is transferred to T' through N'1. In this way this energy is recuperated until the current falls as energy is then taken from the inductance back to the capacitance. This ideal lossless resonance would leave the same current level in the inductance after resonance if C' could exactly reverse its voltage. In practice there are discharge resistive losses in view of the relatively low Q since L'2 is small at the high frequencies involved. Hence, these current values at the start and end of the rise time are not equal and the inductive energy transferred to the capacitance is equal to that lost in parasitic resistances. But since the current Io upon S'1 being turned off can be chosen high by a suitably sized transformer T', the capacitance can resonate with a very high Q for the charge, as opposed to the discharge, and this despite a fast resonant transfer, two things which are normally mutually exclusive.

In the third interval, after D' has become conductive to clamp v to its positive level, the current through this diode decreases linearly, flowing back into V'c. If light-mode periodic operations are used, this current will reach zero and v will remain at its positive level until a new cycle begins with S'1 and S'2 being again closed.

However, in the heavy mode there will be insufficient time for this to occur, i.e. full energy is not returned to the voltage source at the end of each cycle, and steady state operations will take place with a minimum current value larger than zero. As previously noted, this enables an automatic self-compensation for changes in the load, i.e. the value of C'. Assuming for instance an increase of C', on a constant current linear charge basis this implies a longer time for v to reach its positive clamping level, i.e. an increased rise time. As a result there is less time in the cycle for the clamping current to decrease linearly and at the beg inning of the next cycle it will be at a higher level than during the previous steady state conditions. In turn, this higher initial current has the opposite effect of reducing the rise time. In this manner, such transient cycles will lead to new steady state operations at a higher minimum current level but with the original rise time, provided the transformer is designed to handle such levels without saturation.

Figure 4:
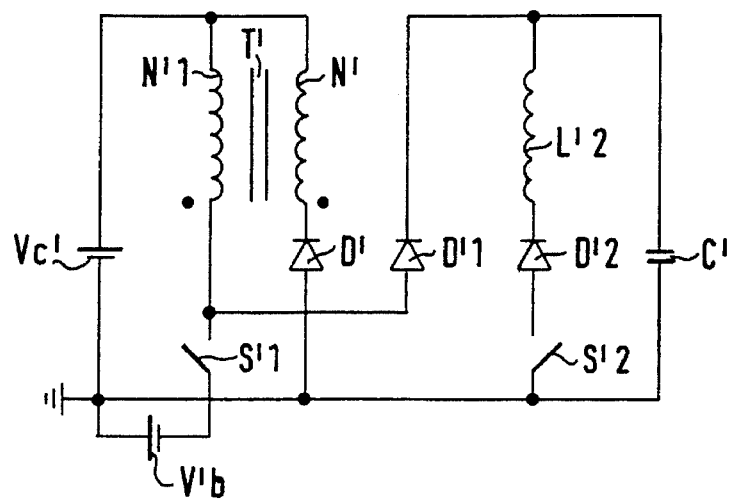
FIG. 4, a modification of FIG. 3, the circuit having no longer a third transformer winding to provide DC isolation.

FIG. 4 shows a modification of FIG. 3 wherein T' no longer has a winding N'1 which provides DC isolation between C' on the one hand and V'c, S'1 on the other. This is made possible by winding N'1 now being used not only to charge C' but also to build up magnetising current before such a charge. Accordingly, N'o is now omitted and the serial combination of N'1 and D'1 is removed from its shown position in FIG. 3 across C' to enable series charging of C' from V'c. Thus, the top end of N'1, in series opposition with N', is now also connected to the positive pole of V'c while the common terminal of S'2 and C' is now directly grounded whilst S' is grounded through a negative DC biassing source V'b. This bias can prevent the undesirable grounding of the live C' terminal, when charged negatively, upon closure of S'1 to send magnetising current through N'1. Indeed, without the V'b bias D'1 would otherwise be made conductive since FIG. 4 shows S'1 now coupled to ground and the junction of N'1 and D'1. Thus, the circuit operates on the same principles as those of FIG. 3.

FIG. 4 could also be modified (not shown) as an illustration of the circuit topology freedom left to the designer, i.e. obtaining this time a high Q circuit for the discharge of C' to its negative level. To apply this to FIG. 4, the polarity of D'1 and D'2 should be reversed (not shown) and the positions of S'1 and N'1 interchanged (not shown), the latter with a polarity reversal (not shown) so as to be in series with N' instead of in opposition. Then, reopening of S'1 will discharge C' to negative clamped level with a high Q. Conversely, C' will be charged positively with a lower Q by a voltage polarity reversal after a half-period of resonance when S'2 is closed. The separate V'b is no longer needed in view of S'1 being now connected to the positive pole of V'c and to the cathode of D'i.

Returning to FIG. 3, the circuit can also operate as a pulse driver when S'2 is no longer operated in synchronism with S'i, e.g. a separate isolated command for S'2 coming from a transformer or opto-coupler. Then S'1, as previously outlined and as initially described in relation to FIG. 3, can be used to charge C' to its positive clamped level whereafter it can be pulsed at a higher frequency than that at which C' is driven. In other words, the time during which v is positive can encompass several periods of pulsed operation for S'1. This enables relatively small amounts of energy to be delivered to C' after its initial charge to replenish leakage losses. Accordingly, a variable duty cycle control operation becomes possible without varying the current I in the transformer. Indeed, without this pulsed operation, if C' is the effective gate to source capacitance of a power supply MOSFET, a variable duty cycle leading to variations in the time during which such a MOSFET is off, i.e. v is negative, will imply a like variation for the time during which S'1 is closed and therefore a corresponding variation in the transformer current. Since S'1 may now be turned on and off at a higher frequency than the v waveform across C', the pulse transformer T' can be smaller.

Figure 5:
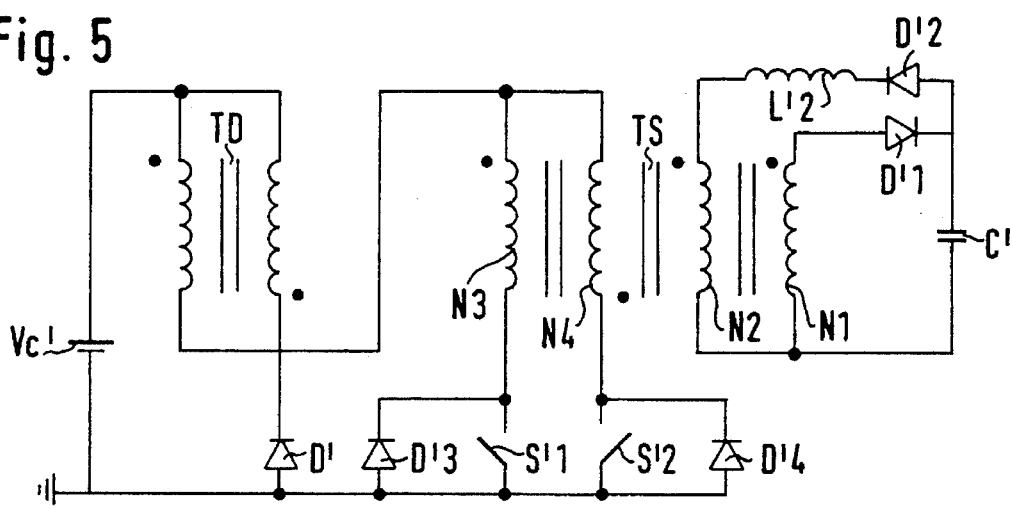
FIG. 5, a modification of FIG. 4, the circuit using 4-winding transformer and an additional 2-winding decoupling transformer.

FIG. 5 shows a modified circuit also operating with the incremental charge amounts, i.e. cup and bucket principle, just described for the circuit of FIG. 3 and which can also be used with FIG. 4. But FIG. 5 allows non-isolated command of both switches as the transformer used to charge and discharge C' can isolate both S'1 and S'2 from C'. As shown, this transformer TS has 4 windings and one of its features is that it can also act as a switch to close the discharging circuit. As a result, to avoid a short circuit at that time on V'c, a 2-winding transformer TD is used for decoupling purposes between V'c, still providing the source of clamping, and TS. This last circuit includes a first winding N1 which can deliver the charging current to C' through D'1 in the same way as N'1 and D'1 in FIG. 3. A second winding N2, in series opposition with the first and connected at one end to its junction with C' can deliver the discharge current through D'2, oppositely poled relative to D'1 as seen from C', in series with separate inductance L'2. The discharge circuit is thus similar to L'2, D'2 in FIG. 3 except that winding N2 of transformer TS now takes the place of switch S'2. The third and fourth windings N3 and N4 are in series aiding with their commoned ends coupled to the positive pole of V'c through winding N'o of 2-winding transformer TD whose second winding N' is branched across V'c through clamping diode D' as in FIG. 3. Since N' and N'o are also in series aiding as in FIG. 3, TD can relay the DC clamping voltage to TS while preventing the latter from short circuiting V'c. In FIG. 5, current can only flow through N'o through winding N3 and/or N4 of TS whose unconnected ends are coupled to the grounded negative pole of V'c through open switches S'1 and S'2 respectively. These are shown to be shunted by diodes D'3 and D'4 respectively whose anodes are grounded like that of D', thereby normally blocking a flow of current from V'c. Since S'1 and S'2, as for the switches in the previous figures, can be constituted by control MOSFETs, D'3 and D'4 can be their body diodes. As shown, the first three windings of TS are oppositely poled with respect to the fourth, i.e. N4.

In operation, S'1 and S'2 can be closed separately as well as simultaneously bringing about distinct results. By first closing and then opening S'2, as before C' will be charged to the positive clamped level (N'+N'o)(V'c/N')(N1/N3) since N3 in series with D'3 provides a first clamping ratio for N1 whereas the remaining factor is the result of TD, with N'o in series aiding with N', the latter serially connected with N3 and D'3 across V'c. Thereafter, S'1 can be pulsed on and off at the higher frequency to replenish the energy in the positively charged C' thereby compensating leakage losses. Whereas the turning on of either MOSFET control switches S'1 or S'2 leads to a flow a current from V'c through the N'o winding of TD and either winding N3 or N4 of TS, when S'1 and S'2 are turned on simultaneously the bottom ends of N3 and N4 will both be grounded. Since these windings with commoned top ends are in series aiding they will produce an effective short circuit reflected on the coupled windings N1 and N2. If this occurs after the positive charging of C', the effective short circuiting of N1 leaves D'1 blocked but that of N2 closes the half-period resonant discharge circuit involving L'2 and D'2. Thus, as before, v will now reach its negative level having a magnitude nearly as large as the positive one. The effective short circuit created by TS in this case will send current through N'o storing magnetic energy in TD. Simultaneous opening of S'1 and S'2 will subsequently lead to D' being made conductive to return this energy to V'c.

Figure 6:
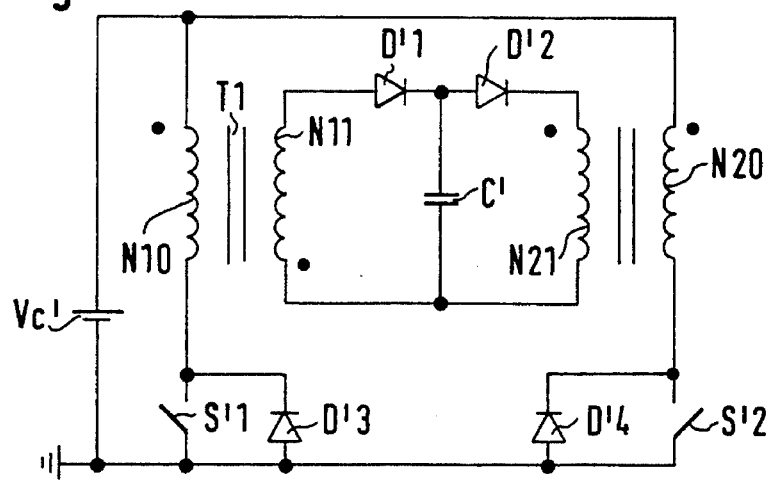
FIG. 6, a modification of FIG. 5, the circuit being now symmetrical and using two 2-winding energy storing transformers.

FIG. 6 shows an adaptation of the circuit of FIG. 3 based on two symmetrical halves enabling both the positive and negative levels of v across C' to be clamped on a high Q basis and eliminating the need for an isolated command for the switches. It uses two like 2-winding transformers T1 and T2 each corresponding to T' in FIG. 3 when omitting its clamping winding N' in series with D'. But whereas T1 shows a phase reversal between its windings N10 and N11, the corresponding windings N20 and N21 are shown to be in phase. Charging C' takes place by first turning S'1 on which, as in FIG. 5, f.i., may be a control MOSFET with its body diode D'3. This stores magnetic energy into T1 when its winding N10 is branched across V'c by the closed S'1. Reopening it will deliver a positive current from the oppositely poled winding N11 into C' through diode D'3 in the same way as in FIG. 3. But the symmetrical circuit involving T2, with its oppositely poled windings N20 and N21, S'2 and D'4 now enables a negative current to be delivered to C' by the on off operation of S'2. Thus, the use of a separate inductance L'2 to secure a half-period of resonance is no longer necessary. Indeed, both the positive and negative C' levels are now clamped through the body diode of the switch having to be closed next in series with the magnetising winding of its associated transformer, e.g. D'4 and T2 when S'1 is turned off to charge C' positively. Indeed, with the shown winding polarities and since D'1 and D'2 are also oppositely poled with regard to N11 and N21 respectively, when C' is being charged positively through D'1, D'2 will be able to provide clamping to V'c, assuming unity turns ratios for both T1 and T2. This is due to both transformers being connected in flyback converter fashion. Thus, the charge and discharge operations can be entirely symmetrical. With the body diode conductive when the switch S'1 or S'2 is turned on this occurs at zero voltage. Both the charge and discharge of C' now occur with a high Q.

While the principles of the invention have been described above in connection with specific apparatus, it is to be clearly understood that this description is made only by way of example and not as a limitation on the scope of the invention.

We claim:

1. Resonant circuit comprising:

switching means (S1/S'1, S2/S'2), in which, for one condition of a first switch (S1/S1) a capacitance (C/C') becomes part of a charging circuit including a DC voltage source (Vp, -Vn/V'c) in series with a first inductance (N1/N'1) and, in which, for one condition of a second switch (S2/S'2) the capacitance (C/C') becomes part of a discharging circuit including a second inductance (N2/N'2); and voltage clamping means ($V_c$, D, N/V'c, D', N') having a clamping inductance (N/N'), a DC clamping voltage source (Vc/V'c) and a clamping diode (D/D') connected in a closed series loop, the clamping diode (D/D') being poled so as to be blocked by the DC clamping voltage source (Vc/V'c), the clamping inductance (N/N') being inductively coupled to the first inductance (N1/N'1) and the second inductance (N2/N'2).

2. Resonant circuit as recited in claim 1, characterized in that the charging circuit includes at least one diode (D1/D'1) and the discharging circuit includes at least one diode (D2/D'2).

3. Resonant circuit as recited in claim 1, characterized in that clamped potentials of opposite polarities are obtained across the capacitance.

4. Resonant circuit as recited in claim 1, characterized in that the resonant circuit includes a transformer having the first inductance (N1/N'1) and the second inductance ((N2/N'2) both connected to the capacitance (C/C').

5. Resonant circuit as recited in claim 4, characterized in that the first switch (S1/S') and the second switch (S2/S'2) are either in series with the capacitance (C/C') or with a winding of the first or second inductance (N/N', N1/N1).

6. Resonant circuit as recited in claim 5, characterized in that the first inductance (N1) is connected in series with the first switch (S1) in the charging circuit and the second inductance (N2) is connected in series with the second switch (S2) in the discharging circuit, the first inductance (N1) and the second inductance (N2) are resistively coupled together at one of their ends to one terminal of the capacitance (C/C') and are coupled at their other ends to respective poles (Vp, -Vn) of the DC voltage source (Vp, Vn/V'c), and both the first and second inductances (N1, N2) also are inductively coupled to the clamping inductance (N) in the voltage clamping means ($V_c$, D, N/V'c, D', N').

7. Resonant circuit as recited in claim 6, characterized in that the first and second inductances (N1, N2) in the charging circuit and discharging circuit are connected to a common point.

8. Resonant circuit as recited in claim 7, characterized in that two voltage levels to which the capacitance (C/C') is clamped are both outside a predetermined range of DC voltage at the two voltage poles of the DC voltage source (Vp, -Vn/V'c).

9. Resonant circuit as recited in claim 8, characterized in that a value of a voltage of a normalized charging source (V/Vc) with respect to that of a clamping source is larger than an absolute value of a difference between a number of turns of normalized charging and discharging windings (+/−(N1/N) −/+(N2/N)) with respect to that of a clamping winding.

10. Resonant circuit as recited in claim 4, characterized in that the voltages of the charging voltage (V) and clamping voltage (Vc) are of equal value.

11. Resonant circuit as in claim 6, characterized in that both the charging and discharging currents are sine waves starting at zero value.

12. Resonant circuit as recited in claim 11, characterized in that the charging circuit and the discharging circuit have a charge (t1)/discharge (t'1) time constant duration which is less than a half-period of natural LC resonance.

13. Resonant circuit as recited in claim 12, characterized in that the time constant duration is more than a quarter-period of natural LC resonance.

14. Resonant circuit as recited in claim 6, characterized in that the voltage charging source is constituted by a secondary winding of a second transformer having its primary winding in series with the first switch (S1) across a DC voltage source.

15. Resonant circuit as recited in claim 10, characterized in that the transformer (T') including the first transformer winding (N') also includes a magnetising winding (N'0) in series with the first switch (S'1) across the DC voltage source (V'c) so as to produced a charging current source for the capacitance (C/C') upon reopening of the first switch (S'1) after its closure.

16. Resonant circuit as recited in claim 10, characterized in that the discharging circuit or the charging circuit is closed by the second switch (S'2) during a half-period of natural LC resonance to invert a voltage potential across the capacitance (C/C').

17. Resonant circuit as recited in claim 15, characterized in that the first and second switches (S1/S', S2/S'2) are closed during a same time interval.

18. Resonant circuit as in claim 17, characterized in that the second switch is operated from an additional transformer winding, such as in the manner of a MOSFET output rectifier.

19. Resonant circuit as in claim 4, characterized in that the clamping diode (D/D') remains conductive upon the capacitance reaching a clamped voltage level only until the clamping diode current is reduced to zero or until the first switch is closed.

20. Resonant circuit as recited in claim 15, characterized in that the second winding (N'1) is coupled in parallel across the capacitance (C').

21. Resonant circuit as in claim 15, characterized in that upon reopening of the switch, the magnetising winding constitutes the second winding serially coupled to the capacitance.

22. Resonant circuit as in claim 21, characterized in that the first switch (S'1) is connected to a DC potential (V'b) distinct from that biassing the capacitance (C').

23. Resonant circuit as in claim 15, characterized in that the second switch (S'2) is periodically operated when the clamping current reaches a minimum steady state value larger than zero.

24. Resonant circuit as in claim 15, characterized in that the first switch is periodically operated at a faster rate than the second switch.

25. Resonant circuit as in claim 15, characterized in that the magnetizing winding (N4) is coupled across the clamping source in series with a winding (N'o) of a second transformer (TD) having a second winding (N') in series aiding therewith branched across the source through a clamping diode (D').

26. Resonant circuit as in claim 15, characterized in that the magnetising winding is part of a 4-winding transformer (TS) having first (N1) and second (N2) interconnected windings in series opposition with one another included in the charging and discharging circuits respectively, and third (N3) and fourth (N4) windings in series aiding with one another and with their interconnected ends being coupled to one pole of the clamping source through the winding (N'o) of the second transformer (TD) while their other ends are coupled to the other pole through the first and second switches respectively, each of the switches being shunted by a diode (D'3/D'4) poled so as to blocked by the DC source.

27. Resonant circuit as in claim 22, characterized in that the transformer (TS) is substantially short circuited when both switches are simultaneously closed, this effectively closing the discharging circuit through its second winding (N2).

28. Resonant circuit as in claim 15, characterized in that two like transformers (T1/T2) may be branched across the DC source through the first and the second switches respectively in series with their magnetising windings (N10/N20), each of the switches being shunted by a diode (D'3/D'4) poled so as to be blocked by the DC source, the capacitance being coupled across the other windings (N11/N21) of the two transformers through respective diodes (D'1/D'2) oppositely poled with respect to the capacitance and one transformer (T1) exhibiting phase reversal between its windings (N10/N11) while the other (T2) has its windings (N20/N21) in phase.

29. Resonant circuit as in claim 1, characterized in that the capacitance is that appearing at the gate of a controlled switch, such as a power MOSFET.

30. Resonant circuit as in claim 25, characterized in that the switches are constituted by control MOSFETs and the shunting diodes (D'3/D'4) by their respective body diodes.

31. Resonant circuit as in claim 2, characterized in that two like transformers (T1/T2) may be branched across the DC source through the first and the second switches respectively in series with their magnetising windings (N10/N20), each of the switches being shunted by a diode (D'3/D'4) poled so as to be blocked by the DC source, the capacitance being coupled across the other windings (N11/N21) of the two transformers through respective diodes (D'1/D'2) oppositely poled with respect to the capacitance and one transformer (T1) exhibiting phase reversal between its windings (N10/N11) while the other (T2) has its windings (N20/N21) in phase.

32. Resonant circuit comprising:
a charging circuit having a DC voltage source (Vp, -Vn/V'c) in series with a first inductance (N1/N'1) and a capacitance (C/C');
a discharging circuit having a second inductance (N2/L'2) in series with the capacitance (C/C');
switching means (S1/S'1, S2/S'2) having a first switch (S1/S'1) for switchably connecting the capacitance (C/C') to the charging circuit, and having a second switch (S2/S'2) for switchably connecting the capacitance (C/C') to the discharging circuit; and
voltage clamping means having a clamping voltage ($V_c$), a clamping diode (D, D') and a clamping inductance (N, N') being connected in a closed series loop, the clamping inductance (N/N') being inductively coupled to the first inductance (N1/N'1) and the second inductance (N2/L'2) with no common connection to either said first inductance (N1/N'1) or said second inductance (N2/L'2), said voltage clamping means being coupled to the capacitance (C/C') for clamping voltage levels of a capacitance charging voltage and a capacitance discharge voltage.

* * * * *

UNITED STATES PATENT AND TRADEMARK OFFICE
CERTIFICATE OF CORRECTION

PATENT NO. : 5,537,021
DATED : July 16, 1996
INVENTOR(S) : Weinberg, S. et al.

It is certified that error appears in the above-indentified patent and that said Letters Patent is hereby corrected as shown below:

At column 14, line 7 (line 3 of claim 1), delete "(S1/S1)" and substitute --(S1/S'1)--.

At column 14, line 36 (line 4 of claim 5), delete "(N/N', N1/N1)." and substitute --(N/N', N1/N'1).--.

Signed and Sealed this

Eighth Day of October, 1996

BRUCE LEHMAN

Attest:

Attesting Officer

Commissioner of Patents and Trademarks